United States Patent
Barkley et al.

(10) Patent No.: US 7,129,770 B2
(45) Date of Patent: Oct. 31, 2006

(54) HIGH VOLTAGE TRACKING BIAS VOLTAGE

(75) Inventors: Gerald J. Barkley, Folsom, CA (US); Mase J. Taub, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 47 days.

(21) Appl. No.: 10/882,512

(22) Filed: Jun. 30, 2004

(65) Prior Publication Data

US 2006/0001479 A1    Jan. 5, 2006

(51) Int. Cl.
*G05F 1/10* (2006.01)
(52) U.S. Cl. ...................... 327/534; 327/333
(58) Field of Classification Search .................. 326/80, 326/81; 327/318, 319, 333, 530, 534, 535, 327/543, 545, 546
See application file for complete search history.

(56) References Cited

U.S. PATENT DOCUMENTS

| | | | | |
|---|---|---|---|---|
| 5,821,800 A | * | 10/1998 | Le et al. | 327/333 |
| 6,040,708 A | * | 3/2000 | Blake et al. | 326/33 |
| 6,556,047 B1 | * | 4/2003 | Debaty | 326/68 |
| 6,563,372 B1 | * | 5/2003 | Fournel | 327/543 |
| 6,639,427 B1 | * | 10/2003 | Dray et al. | 326/83 |
| 6,642,769 B1 | * | 11/2003 | Chang et al. | 327/333 |
| 6,791,391 B1 | * | 9/2004 | Nishimura et al. | 327/333 |

* cited by examiner

*Primary Examiner*—Jeffrey Zweizig
(74) *Attorney, Agent, or Firm*—Blakely, Sokoloff, Taylor & Zafman LLP

(57) ABSTRACT

Methods and apparatuses associated with providing a bias voltage for an n-type and a p-type device. A high voltage may be received and used to derive a bias voltage that would reduce a risk of gate-aided breakdown of the drain-to-substrate channel-side pn-junction in an n-type device. The high voltage may be used to derive a bias voltage that would reduce the risk of gate-aided breakdown of the drain-to-substrate channel-side pn-junction in a p-type device.

29 Claims, 4 Drawing Sheets

HIGH VOLTAGE TRACKING BIAS VOLTAGE

RELATED APPLICATION

This Application is related to U.S. patent application Ser. No. 10/335,824 of Taub, filed on Dec. 31, 2002, entitled "Providing Protection Against Transistor Junction Breakdowns From Supply Voltage," which issued on Aug. 24, 2004 as U.S. Pat. No. 6,781,912, and to U.S. patent application Ser. No. 10/883,361 of Barkley et al., filed on Jun. 30, 2004, entitled "Stress Tolerant High Voltage Back-to-Back Switch," all assigned to a common corporate assignee.

FIELD

Embodiments of the invention relate to transistors and in particular to biasing a transistor with a voltage generated to a level that may reduce risk of reverse breakdown in the transistor.

BACKGROUND

Traditionally, Flash memories have used a high voltage power supply of 12V (VPP) to produce large electric fields to move charge on and off the floating gate of the Flash memory transistors for program and erase operations. A high voltage, for example, 12V, provides a fast program and/or erase time. The speed of program and erase is one component of the success of flash memory devices. Many memory devices now exist in which 12V is used, and many circuits designed for such memory devices are hardwired with a fixed 12V supply to the memory devices.

However, metal-oxide-semiconductor (MOS) transistors have voltage limitations that depend on gate length, oxide thickness, and doping implants. The presence of high voltages on the gate of a MOS transistor can cause the depletion region between the drain and substrate to pinch along the inner drain-substrate junction, in the channel underneath the gate. For large values of $|V_{DG}|$, the depletion region is pinched sufficiently to lower the breakdown voltage between the inner drain-substrate pn-junction. This type of breakdown is commonly referred to as gate-aided breakdown of the drain-substrate pn-junction (BVD), and may result in a reverse-bias current flow that could damage the transistor.

In order to improve speed and reduce cost and power, one or more factors (e.g., gate length, oxide thickness, and/or doping implants) are altered. These same factors that affect the speed, cost, and power may also determine the voltage limitations of MOS transistors, and specifically, the BVD limit, or the threshold voltage at which reverse breakdown may occur in a transistor device. The continued drive to improve speed, and reduce cost and power has resulted in MOS transistor devices, such as Flash memories, whose BVD thresholds are lower than the voltage potential of the 12V power supplies traditionally used to power these devices. Thus, circuits that have the entire power supply potential, such as voltage switches, across the circuit face the risk of breakdown because the potential across the circuit exceeds the BVD.

BRIEF DESCRIPTION OF THE DRAWINGS

The description of embodiments of the invention includes various illustrations by way of example, and not by way of limitation in the figures and accompanying drawings, in which like reference numerals refer to similar elements.

DETAILED DESCRIPTION

Reference herein to "embodiment" means that a particular feature, structure or characteristic described in connection with the described embodiment is included in at least one embodiment of the invention. Thus, the appearance of phrases such as "in one embodiment," or "in alternate an embodiment" may describe various embodiments of the invention, and may not necessarily all refer to the same embodiment.

Figure 1:
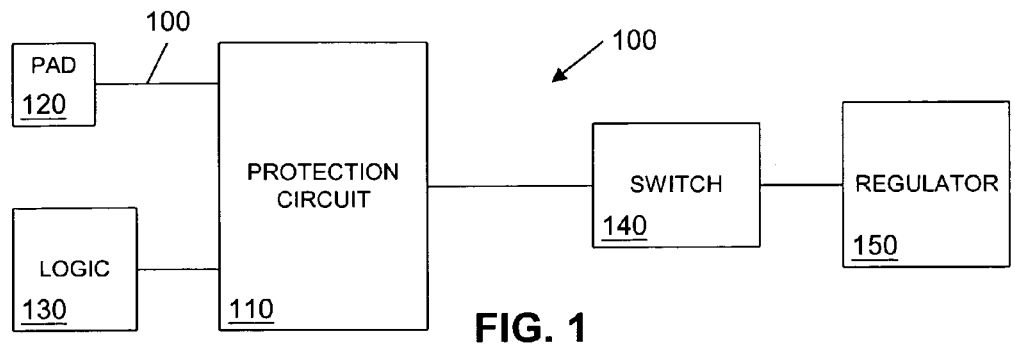
FIG. 1 is block diagram of a system having a power supply interface and a voltage switch in accordance with an embodiment of the invention.

FIG. 1 is block diagram of a system having a power supply interface and a voltage switch in accordance with an embodiment of the invention. System 100 represents a circuit/electronic system that may be on an integrated circuit chip, a system-on-a-chip, a circuit board, etc. The components/elements of FIG. 1 are merely representative of some components that may be a part of system 100; in one embodiment system 100 may have more components than shown in FIG. 1. System 100 may have a circuit and/or subsystem that operates with a higher voltage than another subsystem. For example, switch 140 and/or regulator 150 may have some or all components that operate off a high voltage source.

Protection circuit 110 may include and/or provide high voltage protection. For example, elements of system 100 may operate with 12VDC, and other components with lower voltages (e.g., 1.8V, 1.3V). For example, pad 120 may provide a high voltage from a high voltage power supply, and protection circuit 110 may isolate the high voltage from components of system 100 that may be damaged by a high voltage. The high voltage may exceed a breakdown voltage of certain devices.

In one embodiment protection circuit 110 may receive the high voltage from pad 120, which may represent a pad, pin, interconnect, etc., over which a voltage may be received to system 100. A high voltage may be used with a circuit element of, for example, a memory element, such as an electronically erasable programmable read only memory (EEPROM), a Flash, etc. Pad 110 may be a power supply interface, for example, from a battery, a regulated power supply circuit, etc. In one embodiment pad 110 may reside on a circuit board. Alternatively, pad 110 may reside on an integrated circuit chip.

Logic 130 may generate/produce control signals that are provided to protection circuit 110, and/or potentially other elements of an electronic system with interconnections not shown in FIG. 1. Control signals may include, among others, signals indicating/controlling a memory read, a memory write, a signal associated with voltage switching (e.g., turning on a transistor), etc. Logic 120 represents a control circuit that may have one or more circuit elements, one or more controllers, processors, field programmable gate arrays (FPGAs), discrete components, etc. Logic may be part or all of a circuit and/or have elements in multiple separate circuits that provide control signals.

From the inputs and/or internal circuitry, protection circuit 110 may generate outputs to other components. For example, in one embodiment protection circuit 110 may output one or more bias reference voltages to switch 140, regulator 150, and/or another system component. In one embodiment a bias reference voltage may be provided for p-type devices to bias the p-type devices to produce a gate voltage that avoids a gate-aided breakdown of the drain-to-substrate channel-side pn-junction, or BVD. For example, the bias voltage may be approximately half the high voltage reference potential. In one embodiment a bias reference voltage may be provided for n-type devices to bias the n-type devices to produce a gate voltage that avoids BVD in the n-type devices.

Note that in traditional circuits, the gate of a p-type device may have been tied to the high voltage. However, the BVD threshold in some p-type devices has fallen below the high voltage level used in many current circuits. Thus, tying the gate to the high voltage may create a situation where the gate-to-drain voltage potential exceeds the BVD threshold of the device. Similarly, the gate of an n-type device may have traditionally been tied to a lower-voltage, for example, VCC of a circuit. As the VCC is reduced in some systems, the potential between a gate of an n-type device and a drain or source of the n-type device may likewise exceed a breakdown voltage. The manufacturing processing of the components of system 100 results in the components having certain electrical characteristics. In one embodiment the components have a BVD threshold of less than 12V. For example, the BVD may be approximately 10V, 10.5V, 11.5V, etc. Therefore, the bias voltages may reduce or prevent risk of occurrence of BVD violations.

System 100 may include switch 140, which represents one or more circuits and/or circuit elements to isolate and/or switch a high voltage to a component that may operate at a high voltage level. Switch 140 may receive a bias voltage from protection circuit 130, and/or a high voltage supply or other signals from other components/subsystems of system 100. From the signals received at switch 140 and/or the internal circuitry of switch 140, switch 140 may pass signals to other components. For example, in one embodiment switch 140 may pass the high voltage from pad 120 to regulator 150. Because switch 140 may switch the high voltage, in one embodiment switch 140 has a high voltage potential across the switch in an "off" mode/condition. Thus, the bias voltages may provide protection for switch 140 to prevent BVD.

Regulator 150 represents a circuit/component that in one embodiment may be part of system 100 to regulate, filter, buffer, or otherwise manipulate a voltage/power supply. Regulator 150 may provide multiple levels of regulated voltage. In one embodiment regulator 150 may regulate a high voltage of system 100.

Figure 2:
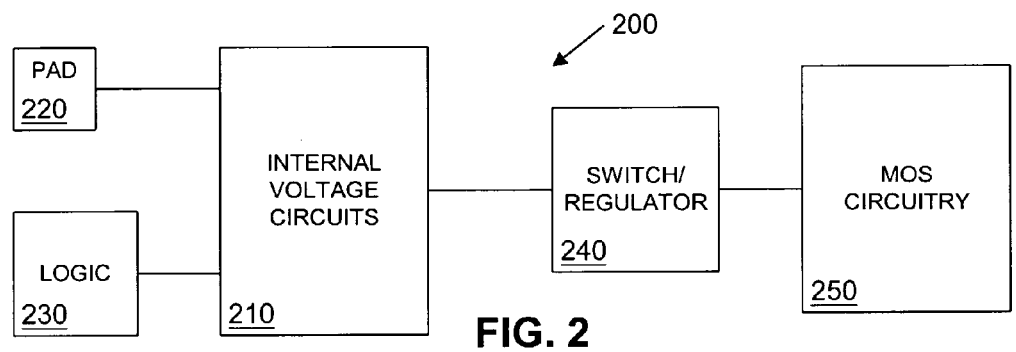
FIG. 2 is block diagram of a system having a power supply interface and MOS circuitry in accordance with an embodiment of the invention.

FIG. 2 is block diagram of a system having a power supply interface and MOS circuitry in accordance with an embodiment of the invention. System 200 may include pad 220 and logic 230, which may be similar to like components of system 100 of FIG. 1. System 200 may include internal voltage circuits 210, which represent one or more circuits/subsystems to provide one or more voltages used in system 200. For example, pad 220 may receive an external voltage from a power supply, battery, voltage regulator, other system, etc., and internal voltage circuits 210 may generate voltages for use with circuits/subsystems internal to system 200 from the external voltage. In one embodiment, internal voltage circuits may have outputs with bias voltages. The bias voltages may be specific to a type of device, a device of a particular type of processing, etc.

In one embodiment system 200 may include switch/regulator 240, which represents one or more circuits that may couple a voltage output from internal voltage circuits 210 with MOS circuitry 250. A switching function of switch/regulator 240 may isolate MOS circuitry 250 from, for example, a high voltage in some instances, and switch the voltage to MOS circuitry 250 in other instances. MOS circuitry 250 represents a metal oxide semiconductor (MOS) circuit. In one embodiment MOS circuitry 250 may be a memory device/element. For example, MOS circuitry 250 may be a bank/array of an EPROM, EEPROM, Flash, etc. For write and/or read applications, a memory element may require a higher voltage than a voltage that may power other components (not shown) of system 100.

Figure 3:
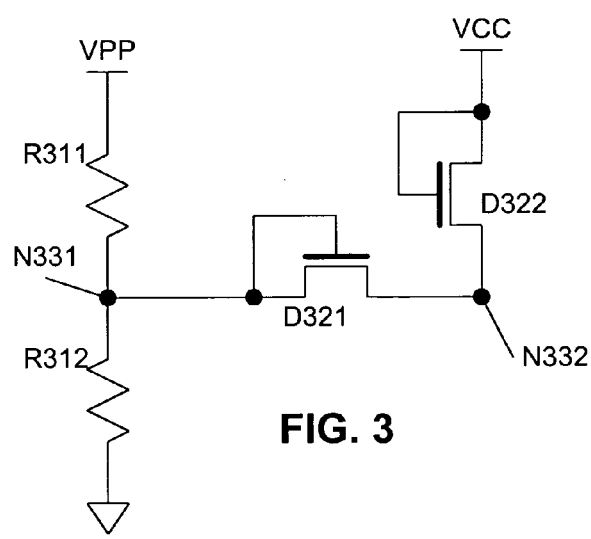
FIG. 3 is schematic representation of a bias voltage generator in accordance with an embodiment of the invention.

FIG. 3 is schematic representation of a bias voltage generator in accordance with an embodiment of the invention. The elements of FIG. 3 are representations of circuits, circuit elements, components, etc., and may in practice consist of more physical components that what is depicted. The elements may have multiple gates, tap points, multiple drains, etc., as is understood in the art.

VPP represents a high voltage that may be received in an electronic system/device. For example, VPP may have a potential of approximately 12V. The resistor pair R311 and R312 represent an equivalent circuit voltage divider, with an output at node N331. The voltage divider operates to divide the potential of VPP in proportion to the equivalent or perceived resistance of R311 and R312. In one embodiment node N331 may be made to have approximately half the potential of VPP by making R311 and R312 of approximately equal value.

In one embodiment node N331 provides a bias voltage that may be output to other circuits. In one embodiment the bias voltage is a p-type device bias voltage, or BIAS_P. BIAS_P may be made, based on the values of R311 and R312, to provide a voltage potential for the gates of p-type devices to reduce the risk of BVD violations of the p-type devices. In one embodiment VPP may be switched on and off. Thus, the value at node N331 may be correspondingly switched between a bias potential of a value related to VPP, to a value of approximately 0V.

The output of node N331 may also be connected with the source and gate of a transistor D321, or a transistor in diode configuration, with the anode coupled to node N331 and the cathode coupled to node N332. In one embodiment node N332 may provide a bias voltage that may be output to other circuits. Node N332 may, for example, be an n-type device bias voltage, or BIAS_N. BIAS_N, as seen in FIG. 3, may a diode drop in potential from node N331. In one embodiment the switching resistance of transistor D321 may be relatively negligible, and node N332 may be approximately equivalent to the potential of node N331.

Note that transistor D321, while connecting node N331 to node N332 when the voltage potential of node N331 is at least a threshold voltage higher than the voltage potential of node N332. However, if the voltage potential of node N331 is lower than the threshold of the potential node N332, transistor D321 will not turn on, preventing a normal operating voltage of higher potential appearing on node N332 from passing to node N331.

In one embodiment node N332 may be coupled to a voltage reference, VCC, through transistor D322, also in diode configuration, with the anode coupled to VCC and the cathode coupled to node N332. VCC represents a voltage that may normally be lower than VPP, unless the source VPP is switched off, as mentioned above, and as described below in greater detail. For example, VCC may be a voltage potential of 5V, 3.3V, 2.5V, 1.8V, etc. In a system of which the circuit of FIG. 3 is a part, an internal operating voltage of subsystems of the system may be lower than the potential of VCC. In one embodiment the gate of n-type devices in the system may be coupled to a voltage reference of a potential of VCC or higher to provide a sufficient voltage potential to turn the n-type devices on.

An n-type device biased by the voltage potential at node N332 may be wanted to remain on, whether or not a bias voltage is provided to p-type devices and/or whether or not VPP is switched on or switched off. Thus, transistor D322 may provide a pull-up to voltage source VCC. As described above, if a maximum potential of VPP is higher than a maximum potential of VCC, when VPP is on, the voltage at node N331 may be sufficiently higher than a potential at node N332 to cause transistor D321 to pass VPP to node N332. However, if VPP is off, the voltage at N331 may approach a ground/low/0V reference, and transistor D321 will isolate node N332 from node N331.

Similarly, transistor D322 may connect/couple node N332 with VCC if the potential of VCC is greater than the potential of node N332, and if the potential of VCC is less than the potential of node N332 (e.g., VPP is switched on), transistor D322 may isolate node N332 from VCC. Transistors D321–D322, while shown as n-type transistors, may be implemented in p-type transistors in another embodiment of the invention. In a configuration where diodes with cathodes on node N332, the voltage level of the higher potential of either VCC or node N331 will be passed to node N332. This can provide a circuit to allow an n-type bias voltage to track to a high voltage (VPP) switched onto a device, and still maintain a bias voltage when the high voltage is switched off to turn the n-type devices on.

Because the voltage of node N332 can be made to track voltage changes in a circuit, the resulting bias level may be referred to as VCC independent. It may be considered VCC independent, because the voltage of node N332, which may be used to bias an n-type device, tracks to whatever voltage may provide a sufficient turn-on bias level, and be high enough to reduce the risk of BVD violation in an n-type device.

Figure 4:
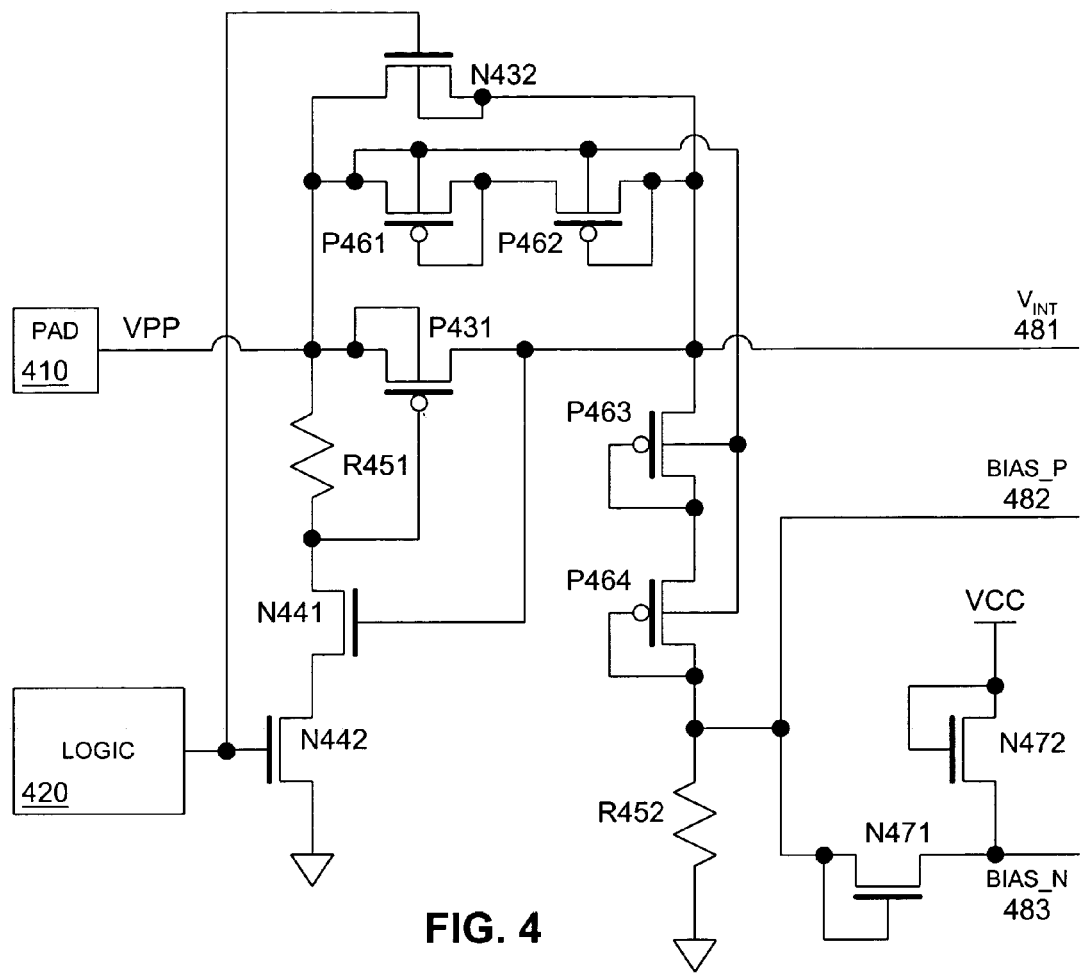
FIG. 4 is schematic representation of a bias voltage generation circuit in accordance with an embodiment of the invention.

FIG. 4 is schematic representation of a bias voltage generation circuit in accordance with an embodiment of the invention. A voltage VPP on pad 410 may be provided to the source of a p-channel MOS input transistor P431. Input transistor P431 may serve as part of a switching circuit to isolate the voltage of pad 410 from other circuit elements. Pad 410 represents a pin, a pad, a connection point, a transmission line, etc., that may supply an external voltage from, e.g., a battery, a DC power supply, another circuit, etc.

The gate of input transistor P431 may be coupled to a switch control circuit having a level shifter formed by elements R451, N441, and N442. The level shifter may receive a control signal from logic 420. Based on the control signal to the gate of input transistor P431, a bias voltage may be selectively generated. Depending upon the voltage level of the supply voltage on pad 410, the level shifter may apply a signal to transistor P431 to result in the transistor switching the voltage of pad 410 to $V_{INT}$ 481.

The level shifter may include a pair of n-channel MOS transistors N441 and N442 connected in series to resistor R451. The drain of transistor N442 may be coupled to the source of transistor N441, and the source of transistor N442 may be tied to a low voltage reference, for example, ground. The gate of transistor N442 may be coupled to logic 420. The drain of transistor N441 may be coupled to one terminal of resistor R451. The other terminal of resistor R451 may be coupled to the source of transistor P431. The gate of transistor N441 may be coupled to the drain of transistor P431.

In one embodiment, logic 420 may generate a control signal or an enable signal to selectively control the switching of input transistor P431. Based on the enable signal, input transistor P431 may transition between an on and off state. A logic one on a control signal to the gate of transistor N442 may turn on transistor N442, which in turn may enable, or turn on, transistor N441. A subsequent current flow through N441 and N442 may incur a voltage division at the gate of transistor P431 of the voltage on pad 410 via resistor R451. The resulting voltage at the gate of transistor P431 may produce a voltage potential between the gate and source of input transistor P431 sufficient to switch the transistor on. When input transistor P431 is transitioned to an on state, P431 may substantially provide the power supply signal at pad 410 as the internal supply signal $V_{INT}$ 481 to a system/subsystem connected to the circuitry of FIG. 4.

In one embodiment, the switching function of the circuitry shown may be performed by input transistor P431 in conjunction with complementary transistor N432. Transistor N432 may have a gate coupled to receive the control signal from logic 420 and a drain coupled to the source of input transistor P431. The source of transistor N432 is coupled to the drain of the input transistor P431. The resulting circuit may provide sufficient voltage to turn on transistor N441 when VPP is biased at a low voltage (e.g., <2V). The circuit may also pass low voltage VCC directly to $V_{INT}$ 481 when VPP is less than a p-device threshold.

In one embodiment, one or more bias voltages may be generated corresponding to or in conjunction with switching of VPP from pad 410 to $V_{INT}$ 481. A bias circuit may include a first pair of series-connected p-channel MOS transistors P461 and P462 coupled to a second pair of p-channel MOS transistors P463 and P464. A resistor R452 may also be coupled in series with the transistors, having one terminal coupled to the drain of transistor P464 and the other terminal coupled to a low voltage reference. In one embodiment, the drain of transistor P464 is coupled to a terminal of resistor R452, and the gate is coupled to the drain, in diode configuration. Transistor P463 may also be in diode configuration, with the drain couple to the source of transistor P464 and the gate coupled to the drain. The substrates of transistors P463 and P464 may be coupled to a high voltage, for example, the input voltage of pad 410.

The source of transistor P463 may be coupled to $V_{INT}$ 481, which may also be coupled with the drain of input transistor P431, the source of transistor N432, and the drain of transistor P462. Transistor P462 may have its gate coupled to its drain, and its source coupled to the drain and gate of transistor P461. The body of both transistors P462 and P461 are coupled to the source of transistor P461, which may be coupled to pad 410.

Note that when input transistor P431 is on and switching a voltage VPP from pad 410 to $V_{INT}$ 481, transistors P461 and P462 will be off. $V_{INT}$ 481 will receive a high voltage, and result in transistors P463 and P464 turning on, causing a current to flow through resistor R452. The value of R452 may be chosen to cause a voltage division at the drain of transistor P464 based upon the expected current flow through resistor R452 from transistors P463 and P464. When the switch is on, a current will flow from transistors P431 and N432 to transistors P463 and P464. The output voltage on the drain of transistor P464 is BIAS_P 482. In one embodiment, BIAS_P 482 represents a p-type device bias level. Resistor R452 may be selected to generate a voltage BIAS_P 482 to, when coupled to a p-type transistor gate, reduce a risk of BVD of the transistor when $V_{INT}$ 481 is a high voltage VPP of pad 410 on the transistor source.

If input transistor P431 is off, the voltage potential VPP of pad 410 is not switched to $V_{INT}$ 481, which may be provided with a reduced voltage level from the bias circuit. For example, when input transistor P431 is off, the voltage at the drain of P431 and $V_{INT}$ 481 may drop below the level on pad 410. The drop in potential may cause transistors P461 and P462 to turn on, causing a current to flow through these devices. The potential at $V_{INT}$ 481 may be a reduced voltage, meaning a lower voltage than the potential on pad 410, and may deliver current to transistors P463 and P464 that will cause a voltage across resistor R452. Note that the voltage across resistor R452 (and thus the voltage at BIAS_P 482) may be substantially equivalent to the voltage at BIAS_P 482 when the switch is on. Alternatively, a reduced BIAS_P 482 voltage may result when a reduced $V_{INT}$ 481 is generated.

In one embodiment the voltage potential of BIAS_P 482 may also be delivered to another circuit to generate a bias voltage BIAS_N 483 for n-type devices. In some circuit configurations an n-type device may see a potential across it that is greater than a breakdown voltage of the device. Traditionally, the n-type device may have been biased at a lower voltage, for example, VCC of 1.8V, 1.2V, etc. However, as BVD thresholds and the VCC operating voltages decrease, a BVD violation could result in an n-type transistor that is not biased with a higher voltage than VCC. Thus, BIAS_N 483 may be provided, as derived from a high voltage VPP, to provide a bias level for n-type devices that may track a high voltage $V_{INT}$ 481 of a circuit, and provide BVD threshold violation protection.

In one embodiment, a wired OR configuration may be provided off BIAS_P 482 to generate BIAS_N 483. A transistor N471 may be coupled in diode configuration with a gate and a drain coupled with BIAS_P 482, and a source coupled with BIAS_N 483. Thus, when BIAS_P 482 is at a higher potential than BIAS_N 483, N471 will turn on and conduct substantially the potential of BIAS_P 482 to BIAS_N 483. Similarly, a transistor N472 has a drain coupled with a potential VCC that is generally at a lower maximum voltage potential than a maximum voltage potential of VPP from pad 410. The source of transistor N472 is coupled with BIAS_N 483, at the source of transistor N471. The gate of transistor N472 may be coupled with the source of transistor N472, if implemented as a p-type transistor, or with the drain of transistor N472, if implemented as an n-type transistor as shown.

The circuit of BIAS_N 483 in operation provides for transistor N472 to turn on when the potential at the source of N472 may be lower than the potential of VCC, and will turn off when the potential is higher than VCC. In one embodiment the voltage $V_{INT}$ 481 may be driven low when transistors P431 and N432 are turned off. With a low enough potential on $V_{INT}$ 481, the voltage level that may result on the drain of N471 may be lower than VCC. In this case, transistor N471 will turn off and transistor N472 will turn on, and BIAS_N 483 will be driven to be substantially the voltage level of VCC.

In one embodiment, the voltage $V_{INT}$ 481 may be driven to a lower voltage level than VPP, and BIAS_P 482 may be correspondingly driven closer to $V_{INT}$ 482. The relatively low potential difference between BIAS_P 482 and $V_{INT}$ 481 may be insufficient to cause a p-type device with a source coupled to $V_{INT}$ 481 and a gate coupled to BIAS_P 482 to turn on. The lower voltage level of $V_{INT}$ 481 may be sufficiently low to result in BIAS_N 483 being driven to a lower voltage potential than needed to turn on an n-type device. However, BIAS_N 483 may still be desired to be at a high enough voltage potential to turn on an n-type device biased by BIAS_N 483. Thus, if the voltage level drops, a voltage of VCC may be provided to BIAS_N 483 sufficient to turn on an n-type device.

Figure 5:
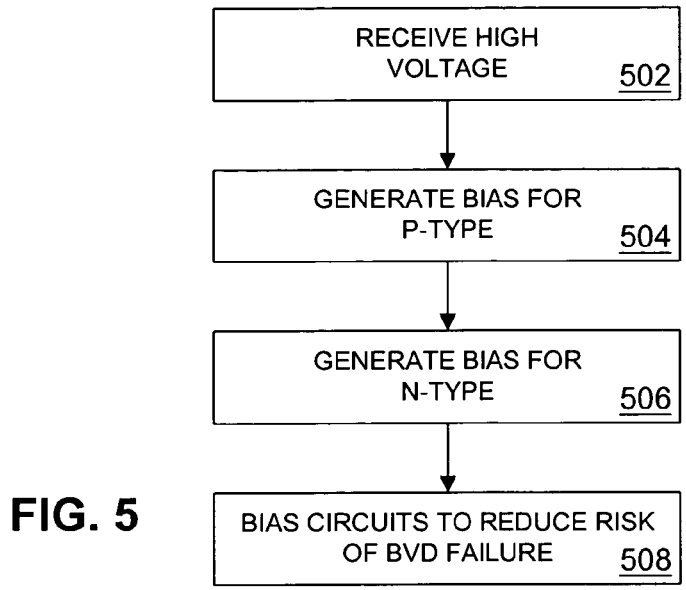
FIG. 5 is flow diagram of providing a bias voltage to protect against high voltage breakdown in accordance with an embodiment of the invention.

FIG. 5 is flow diagram of providing a bias voltage to protect against high voltage breakdown in accordance with an embodiment of the invention. A high voltage is received, 502. In one embodiment the high voltage may be a voltage to perform read and/or write operations from/to a memory device. The voltage may be, for example, switched on by a high-voltage isolation/switching circuit.

From the high voltage one or more bias voltages may be derived. In one embodiment a p-type device bias voltage may be derived from the high voltage, 504. The p-type bias may be derived as a ratio of the high voltage, as a function of a voltage divider circuit. The voltage level or potential of the p-type bias may be selected to reduce the risk of a BVD violation. In one embodiment an n-type device bias voltage may be derived from the high voltage, 506. The n-type bias may be derived based at least in part on a ratio of the high voltage. The n-type bias may be a voltage level stepped down from the p-type bias. In one embodiment the n-type bias may be selectively coupled with the p-type bias through a diode. The n-type bias may be selectively derived based on one of multiple input voltages, where the high voltage is selected for the n-type bias level.

When a bias voltage level has been generated, circuits are biased to reduce the risk of BVD failure of a system, 508. Both the p-type and the n-type bias may be selected to be a voltage of an intermediate value between a high voltage and a low voltage potential. For example, a half-voltage level may be used. Alternatively, other voltage levels may be used, for example, one-third, two-thirds, etc. This bias voltage may be selected based on an expected BVD characteristic of transistor devices the bias voltage will be directed to protecting from BVD violation.

Figure 6:
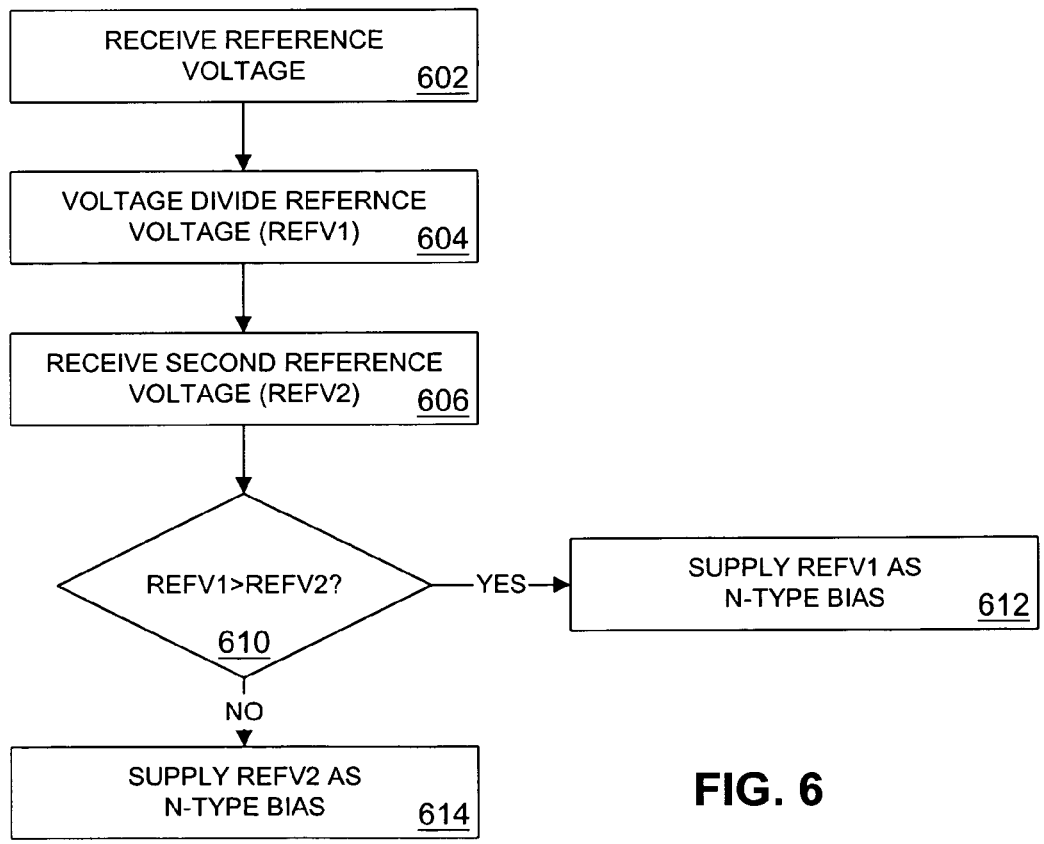
FIG. 6 is flow diagram of providing a higher of two voltage potentials as a bias voltage in accordance with an embodiment of the invention.

FIG. 6 is flow diagram of providing a higher of two voltage potentials as a bias voltage in accordance with an embodiment of the invention. A reference voltage may be received, 602. The reference voltage may be a 12V supply, or other voltage supply/source from a regulated power supply to provide fast erase and/or write times for a Flash memory.

In one embodiment the reference voltage may be voltage divided to produce a reference voltage, REFV1, 604. REFV1 may be coupled with an anode of a diode, the cathode of which may be coupled to another circuit point. REFV1 represents a reference, or standard voltage value that may be shared among multiple devices as a standard value point in a system. REFV1 may be a bias voltage of a value somewhere between a high voltage received reference voltage and a low voltage reference, or ground.

In one embodiment a second reference voltage supply/source, REFV2, may be received, 606. In one embodiment REFV2 may be received at the anode of a diode that drive a node to approximately or equal the voltage level of REFV2. REFV2 may be used in a circumstance where REFV1 may be insufficient to result in a transistor biased by a node at the cathodes of REFV1 and REFV2.

It may be determined whether REFV1 is greater than REFV2, or vice versa, 610. In one embodiment this occurs automatically by the design of the circuit. For example, in the case of a dual diode configuration, the cathodes of two diodes may be coupled together, with the anode of each coupled to the separate voltage of reference of interest. Such a design may allow only a higher of the two references to pass to node coupling the cathodes. The design may be made to facilitate biasing of circuits for reverse breakdown protection.

Assuming that REFV1 is greater than REFV2, the reference REFV1 may serve as the n-type bias voltage level, 612. Assuming that REFV2 is greater than REFV1, the reference REFV2 may serve as the n-type bias voltage level, 614.

Figure 7:
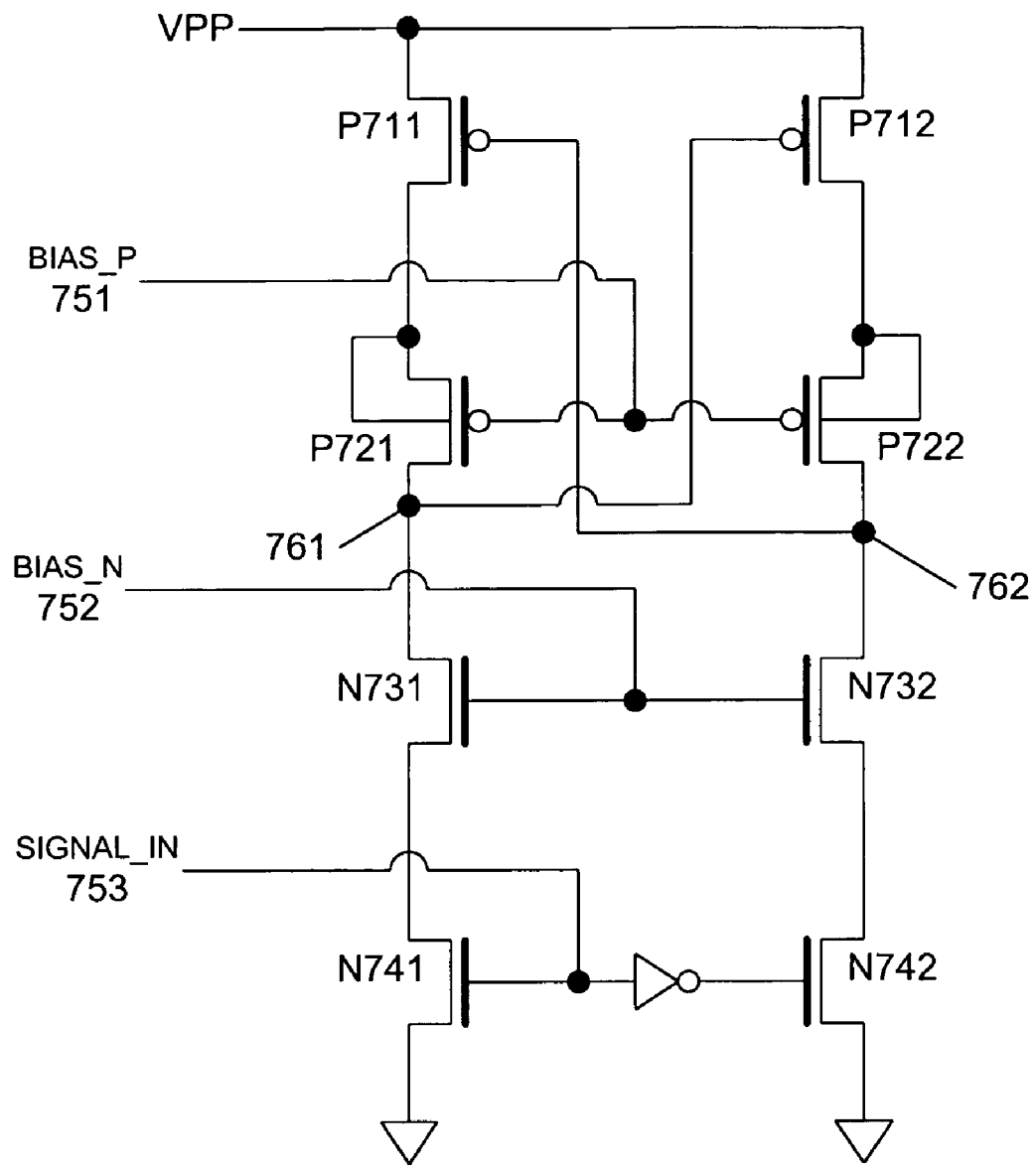
FIG. 7 is schematic representation of circuit with bias voltages cascoded in accordance with an embodiment of the invention.

FIG. 7 is schematic representation of circuit with bias voltages cascoded in accordance with an embodiment of the invention. The circuit of FIG. 7 may represent a level shifter used to switch logical values corresponding to, and at higher voltages than received logic values. For example, in a Flash memory environment, a series of logic bits may be produced to indicate a read or write function, and/or to indicate data, and received at a circuit. The series of received logic bits may be at a voltage level of an internal voltage (e.g., approximately 1.0V) of an electronic circuit, which may be less than a voltage (e.g., approximately 12V) that may be used to perform operations with the Flash. Thus, for the received bits to be effective at the Flash for fast read and/or write operations, the bits may need to be DC-shifted from the internal voltage level to the Flash voltage level.

VPP represents the high voltage for use with a load circuit (not shown), for example, a Flash or other memory circuit. The load circuit may interface with the circuit of FIG. 7 at output node 762. A load circuit may also be interfaced with node 761, which will be the inverse of the output of node 762, as described below. Signal_in 753 represents a signal line that receives the logic bits, meaning the series of voltage swings on a transmission line to represent digital data. Traditional circuits employing transistor devices with BVD thresholds sufficient to avoid BVD violations based on a high voltage of VPP may not have used the cascoded circuits with BIAS_P 751 and/or BIAS_N 752.

The interconnection of FIG. 7 includes a high voltage potential VPP, which is connected to the source of a p-channel transistor P711 and a p-channel transistor P712. The drain of transistor P711 may be coupled in series with the source of an additional p-channel transistor P721. The drain of transistor P721 may be coupled to the gate of transistor P712. Likewise, the drain of transistor P712 may be coupled in series with the source of an additional p-channel transistor P722. The drain of transistor P722 may be coupled with the gate of transistor P711. The gates of transistors P721 and P722 are coupled to each other, and receive a voltage BIAS_P 751. BIAS_P 751 may be a voltage potential intermediate to VPP and the low reference analog ground depicted in FIG. 7.

The low voltage reference may be an analog ground for the circuit, and may be coupled to the source of n-channel transistors N741 and N742. The gate of transistor N741 may be coupled to receive input signal signal_in 753. The gate of transistor N742 receives an inverted signal_in 753. Note that signal_in 753 will be of a voltage potential sufficient to turn on an n-channel transistor. With the gates to receive inverted versions of signal_in 753, when the logic value of signal_in 753 turns on transistor N741, transistor N742 should be off, and vice versa. The drain of transistor N741 may be coupled with the source of an additional n-channel transistor N731, and the drain of transistor N742 may be coupled with the source of an additional n-channel transistor N732.

In one embodiment the gates of transistors N731 and N732 may be coupled, and receive a bias voltage of BIAS_N 752. The level of BIAS_N 752 may be derived from VPP, and may be related to the level of BIAS_P 751. Note that BIAS_N 752 may be made to track a voltage level of a system of which the circuitry of FIG. 7 is a part, and provide for node 761 to be driven to the level of the drain of transistor N741, and similarly node 762 being driven to the level of the drain of transistor N742, when the transistors N731 and N732 conduct current.

The operation of the circuit of FIG. 7 may be summarized as follows. For purposes of illustration, assume that the analog reference is 0V, and that VPP is 12V. Note that other voltages may be used. If a logic zero appears on signal_in 753, the gate of transistor N741 is zero, and N741 is off. Because N741 is off, the voltage level of its drain is indeterminate. Thus, the drain of transistor N731 will float to a voltage level to which node 761 is driven. If a logic zero appears on signal_in 753, the gate of transistor N742 will be a logic high, and N742 may be on. Thus, transistor N742 will sink its drain to 0V, and may cause a potential sufficient between BIAS_N 752 and the source of transistor N732 to turn N732 on. With transistor N732 on, it will sink node 762 to the voltage potential of the drain of N742, which will in turn be sunk to ground. Thus, the voltage level of the output node 762 will be approximately 0V.

Because node 762 is at 0V, the gate of P711 may have a sufficient potential difference with VPP at the source of P711 to turn transistor P711 on, and cause P711 to pull the source of transistor P721 to high voltage VPP, assumed in this example to be 12V. BIAS_P 751 may be set to a voltage level that is intermediate to VPP and ground, and thus, BIAS_P 751 may be at a low enough potential to cause the 12V on the source of transistor P721 to turn on. With series transistor P721 also on, node 761 will be pulled to approximately 12V. Thus, a zero on signal_in 753 results in a 0V output at node 762, and a 12V output at node 761.

A logic one on signal_in 753 will produce a similar result, but in reverse. The logic high may turn on N741 and turn off N742. Transistor N741 will pull down the source of N731, which may also be on due to the voltage potential of BIAS_N 752. Thus, the voltage potential of node 761 will be pulled low to approximately 0V. In contrast, N742 will have an indeterminate drain voltage level, and the drain of N732 will float.

The 0V at node 761 may turn on P712 and cause it to pull up the source of P722, causing the series to pull node 762 high to 12V. The high voltage at node 762 will turn off P711, and cause the drain of P711 to float.

Note that in the descriptions above, if not for the cascoded transistor pair P721 and P722, there may be conditions that cause a 12V potential across either transistor P711 or transistor P712. In one embodiment a 12V potential will cause a BVD violation. Thus, when, for example, transistor P711 is off because its gate is pulled high, rather than a 0V potential appearing on its drain, its drain floats. The 0V appears on the drain of P721 instead of P711, and the gate of P721 is driven at BIAS_P 751, which is intermediate between VPP and ground. Thus, the drain of P711 floats to a safe potential (no BVD violation), and the level of BIAS_P 751 can be maintained to protect against a BVD violation on P721.

Similar conditions may exist in the n-channel transistors N741 and N742 in traditional circuits. When, for example, node 762 is pulled up to 12V, the drain of N742 may have been caused to have 12V, while the gate may only have a potential of approximately 0V. This may cause a BVD violation, based upon the physical processing of the device. However, with additional transistor N732 biased at a BVD-safe voltage level of BIAS_N 752, a potential lower than the BVD threshold may be maintained across N732, and cause the drain of N742 to be at a sufficiently low voltage to prevent a BVD violation in N742.

Besides what is described herein, it will be appreciated that various modifications may be made to embodiments of the invention without departing from their scope. Therefore, the illustrations and examples herein should be construed in an illustrative, and not a restrictive sense. The scope of the invention should be measured solely by reference to the claims that follow.

What is claimed is:

1. A method comprising:
   providing a bias voltage for a gate of a p-type transistor derived from a high voltage input, the p-type bias voltage based at least in part on a breakdown voltage of the p-type transistor; and
   providing a bias voltage for a gate of an n-type transistor derived from the high voltage input, the n-type bias voltage based at least in part on a breakdown voltage of the n-type transistor.

2. A method according to claim 1, wherein providing the bias voltage derived from the high voltage input comprises providing the bias voltage from a voltage input of approximately 12V.

3. A method according to claim 2, wherein providing the p-type bias voltage based on the breakdown voltage of the p-type transistor comprises providing the p-type bias voltage based at least in part on a voltage level of approximately 10V.

4. A method according to claim 2, wherein providing the n-type bias voltage based on the breakdown voltage of the n-type transistor comprises providing the n-type bias voltage based at least in part on a voltage level of approximately 10V.

5. A method according to claim 1, wherein providing the p-type bias voltage derived from the high voltage comprises generating the p-type bias voltage from the high voltage with a resistive voltage divider.

6. A method according to claim 5, wherein providing the n-type bias voltage derived from the high voltage comprises selecting as the n-type bias voltage the higher voltage potential of either the p-type bias voltage or a voltage source sufficient to turn on an n-type transistor, the potential of the voltage source to be lower than the high voltage input.

7. A method according to claim 1, wherein providing the n-type bias voltage derived from the high voltage comprises generating the n-type bias voltage with a wired-OR circuit.

8. A method according to claim 7, wherein generating the n-type bias voltage with the wired-OR circuit comprises enabling a transistor to provide substantially the potential of the p-type bias voltage as the n-type bias voltage, if the p-type bias voltage has a sufficient potential to enable an n-type transistor.

9. A method according to claim 8, wherein generating the n-type bias voltage with the wired-OR circuit comprises enabling a transistor to provide a voltage supply as the n-type bias voltage if the p-type bias voltage has insufficient potential to enable the n-type transistor.

10. A circuit comprising:
    a first transistor in diode configuration, having an anode coupled with an output of a voltage divider that serves as a first voltage reference and a cathode coupled with a circuit output point, the voltage divider to divide a high voltage received in a system, the first voltage reference and the circuit output point to provide separate transistor bias voltages; and
    a second transistor in diode configuration, having an anode coupled with a second voltage reference and a cathode coupled with the circuit output point, the second voltage reference to have a lower maximum potential than the high voltage.

11. A circuit according to claim 10, wherein the high voltage comprises approximately a 12V potential.

12. A circuit according to claim 10, wherein the first voltage reference comprises a bias voltage for a gate of a p-channel MOS transistor.

13. A circuit according to claim 10, wherein the circuit output point comprises a bias voltage for a gate of an n-channel MOS transistor.

14. A circuit according to claim 10, wherein the second transistor includes a turn-on threshold to cause the second transistor to turn on if the first voltage reference is of a voltage potential lower than an n-channel MOS transistor turn-on voltage threshold ($V_{tn}$).

15. An apparatus comprising:
    a first voltage reference node to interconnect with a terminal of an upper leg of a voltage-divider circuit, a terminal of a lower leg of the voltage divider circuit, and a drain and gate of a first transistor, the voltage divider circuit to divide a high voltage input to an intermediate level at the first reference node; and
    a second voltage reference node to interconnect with a source of the first transistor, and a source of a second transistor, a drain of the second transistor to be coupled with a voltage source of lower potential than the high voltage input, a gate of the second transistor to be coupled to a bias node.

16. An apparatus according to claim 15, further comprising the first node to interconnect with and bias a gate of a p-type transistor.

17. An apparatus according to claim 15, wherein the upper leg of the voltage-divider circuit comprises series-connected transistors.

18. An apparatus according to claim 15, wherein the lower leg of the voltage-divider circuit comprises a resistor.

19. An apparatus according to claim 15, wherein the intermediate level comprises a voltage level of approximately one-half the high voltage input.

20. An apparatus according to claim 15, wherein the second transistor comprises an n-type transistor, and further comprising the second node to interconnect with and bias the gate of the second transistor.

21. An apparatus according to claim 15, wherein the second transistor pulls up the second node to the voltage source if the potential of the first node drops below a threshold voltage.

22. An apparatus according to claim 21, wherein the threshold voltage comprises approximately a transistor turn-on voltage threshold ($V_t$).

23. A system comprising:
    a transistor bias generator having
    a first diode circuit having an anode coupled with a reference voltage node for a p-type device at a node of a voltage divider, the voltage divider to generate a reduced voltage from a high voltage supply input, a difference in voltage potential between the reduced voltage and the high voltage to be less than a reverse breakdown voltage threshold of a p-type device; and a second diode circuit having an anode coupled with a low voltage supply input, and a cathode coupled with a cathode of the first diode circuit at a reference voltage node for an n-type device; and a high voltage switching circuit coupled with the bias generator to have a gate of a p-type transistor biased at the p-type reference voltage and a gate of an n-type transistor biased at the n-type reference voltage.

24. A system according to claim 23, wherein the p-type transistor and the n-type transistor of the high voltage switching circuit comprise transistors of a level shifter of the switching circuit.

25. A system according to claim 23, further comprising a memory array coupled with the high voltage switching circuit to be switched the high voltage.

26. A system according to claim 25, wherein the memory array comprises a Flash memory circuit.

27. A circuit comprising:

a resistor of a voltage-divider circuit, the voltage-divider circuit to receive a high voltage, the resistor having a terminal coupled to a ground reference and a second terminal coupled to gate and drain of a first n-channel MOS transistor, the second terminal to provide a bias voltage for a p-channel transistor in a high voltage switching circuit;

the first transistor having the gate and drain coupled to the second terminal of the resistor, and a source coupled with a second n-channel MOS transistor; and the second transistor having a drain and gate coupled to a regulated voltage source, the voltage source maintained to be at a voltage level at least as high as a turn on voltage of an n-type transistor, and a source coupled to the source of the first transistor, the first and second transistors to selectively pass the higher of the voltage at the second terminal of the resistor and the voltage source to provide a bias voltage for an n-channel transistor in a high voltage switching circuit.

28. A circuit according to claim 27, wherein the voltage at the second terminal of the resistor comprises approximately a 6V potential.

29. A circuit according to claim 27, further comprising a control circuit coupled with the voltage divider circuit to selectively switch off the high voltage and result in the voltage at the second terminal of the resistor to achieve a potential below the regulated voltage source.

* * * * *